United States Patent [19]

Ikeda et al.

[11] Patent Number: 5,210,054

[45] Date of Patent: May 11, 1993

[54] METHOD FOR FORMING A CONTACT PLUG

[75] Inventors: Yujiro Ikeda, Ikoma; Takao Kinoshita, Tenri, both of Japan

[73] Assignee: Sharp Kabushiki Kaisha, Osaka, Japan

[21] Appl. No.: 791,274

[22] Filed: Nov. 13, 1991

[30] Foreign Application Priority Data

Nov. 16, 1990 [JP] Japan .................................. 2-312149

[51] Int. Cl.⁵ ........................................... H01L 21/44
[52] U.S. Cl. .................................. 437/195; 437/228; 437/978; 156/653
[58] Field of Search ............... 437/195, 228, 229, 982, 437/981, 947, 187; 156/653

[56] References Cited

U.S. PATENT DOCUMENTS

| | | |
|---|---|---|
| 4,263,603 | 4/1981 | Jillie, Jr. ..................................... 357/5 |
| 4,753,709 | 6/1988 | Welch et al. ......................... 156/643 |
| 4,824,767 | 4/1989 | Chambers et al. ................... 156/653 |

FOREIGN PATENT DOCUMENTS

| | | | |
|---|---|---|---|
| 1-10628 | 1/1989 | Japan | .................................. 437/978 |
| 2-239625 | 9/1990 | Japan | .................................. 437/978 |

Primary Examiner—T. N. Quach
Attorney, Agent, or Firm—Nixon & Vanderhye

[57] ABSTRACT

A method for forming a contact plug comprising steps of depositing on a semiconductor substrate provided with a base device an interlayer insulator consisting of lowermost, intermediate and uppermost layers in which the intermediate layer is less sensitive to an etchant which is capable of dissolving the lowermost layer; subjecting the resultant substrate to a thermal treatment to planarize the surface of the uppermost layer; forming a contact hole by dry-etching at an intended contact region of the interlayer insulator; subjecting the contact hole to wet-etching with an etchant which is capable of dissolving the lowermost layer of the interlayer insulator to form a stepped portion between the edges of the lowermost layer and the intermediate layer in the contact hole; and depositing a metal in the resulting contact hole to form a contact plug, thereby preventing the contact plug from peeling off the substrate.

5 Claims, 1 Drawing Sheet

FIG.2 *(PRIOR ART)*

METHOD FOR FORMING A CONTACT PLUG

BACKGROUND OF THE INVENTION

1. Field of the Invention

The present invention relates to a method for forming a contact plug. Especially, the present invention is utilized for fabricating a contact plug in VLSI (very large scale integrated circuit) such as MOS or bipolar devices (e.g., DRAM, SRAM, E$^2$PROM or mask ROM), CCD or the like.

2. Prior Art

Recently, LSI has been remarkably miniaturized, which has led to a highly reduced diameter of a contact hole. Conventional sputtering techniques for metal deposition cannot be used for plugging up the contact hole having subhalf micron diameter because of their poor step coverage. Instead of the sputtering techniques, there has been developed a selective tungsten deposition technique in accordance with CVD method.

A conventional method for forming a contact plug comprises, as shown in FIG. 2, depositing successively a silicate glass layer 12 and boron phosphorus silicate glass layer 13 on a semiconductor substrate 11 provided with a base device, fluidizing the boron phosphorus silicate glass layer by heating to planarize the surface thereof in order to complete a stacked interlayer insulator for a multilevel connection, forming a contact hole by photolithography at an intended contact region of the interlayer insulator, and then forming a contact plug 14 in the contact hole by the selective tungsten deposition in accordance with CVD method.

However, this method has a problem that the contact plug made of tungsten peels off at the interface.

The present invention is accomplished in order to solve the aforesaid problem and provides a method for forming a contact plug possessing excellent reliability without causing the peeling of the contact plug.

SUMMARY OF THE INVENTION

The present invention thus provides a method for forming a contact plug comprising steps of depositing on a semiconductor substrate provided with a base device an interlayer insulator consisting of lowermost, intermediate and uppermost layers in which the intermediate layer is less sensitive to an etchant which is capable of dissolving the lowermost layer; subjecting the resultant substrate to a thermal treatment to planarize the surface of the uppermost layer; forming a contact hole by dry-etching at an intended contact region of the interlayer insulator; subjecting the contact hole to wet-etching with an etchant which is capable of dissolving the lowermost layer of the interlayer insulator to form a stepped portion between the edges of the lowermost layer and the intermediate layer in the contact hole; and depositing a metal in the resulting contact hole to form a contact plug.

BRIEF DESCRIPTION OF THE DRAWINGS

FIG. 2 is an explanatory view schematically showing a conventional contact plug.

DETAILED DESCRIPTION OF THE PREFERRED EMBODIMENTS

Figure 1:
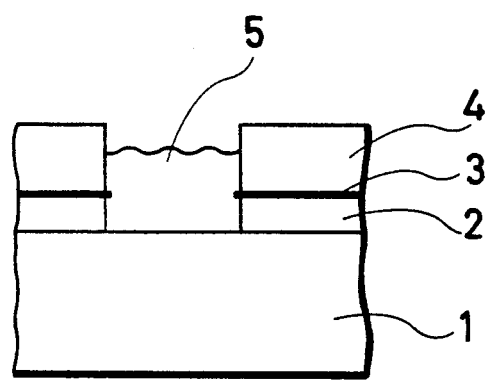
FIG. 1 is an explanatory view schematically showing a contact plug formed in accordance with a method of the present invention.
Figure 1:
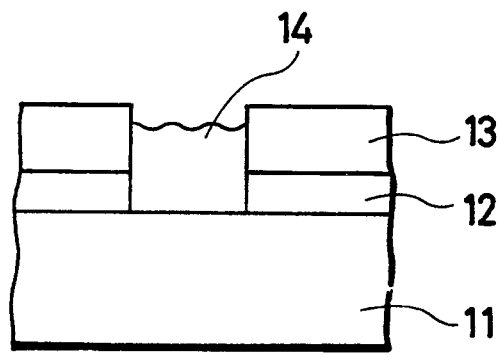

In the method of the present invention, a lowermost layer, e.g., a silicate glass layer, an intermediate layer, e.g., silicon nitride layer and an uppermost layer, e.g., boron phosphorus silicate glass layer, are successively deposited on a semiconductor substrate provided with a base device, followed by subjecting the resultant substrate to a thermal treatment to planarize the uppermost layer to thereby form a triple-layered interlayer insulator for multilevel connection comprising said lowermost layer (silicate glass layer), intermediate layer [silicon nitride layer) and uppermost layer (boron phosphorus silicate glass layer). The semiconductor substrate, which is generally made of silicon, is provided with a base device such as channel, source, drain or the like.

The lowermost layer of the triple-layered interlayer insulator for multilevel connection comprises, for example, a silicate glass layer which can be formed by, for example, depositing a nondoped silicate glass (NSG) layer or the like by CVD method at a temperature of about 370° to 430 ° C.

The intermediate layer of the interlayer insulator comprises, for example, a silicon nitride layer which can be formed, for example, by depositing Si$_3$N$_4$ layer or the like by low pressure CVD (LPCVD) method at a temperature of about 700° to 850 ° C.

The uppermost layer of the interlayer insulator comprises, for example, a boron phoshpurus silicate glass layer which can be formed, for example, by depositing a silicate glass layer doped with boron (B) and phosphorus (P) by CVD method at a temperature of about 370° to 430 ° C.

The thermal treatment for fluidizing the resultant substrate to planarize the surface thereof is usually performed under the presence of N$_2$ gas, O$_2$ gas, water vapor or the like at about 700° to 950 ° C.

The intermediate layer of the interlayer insulator should be made of a material which is less sensitive (less soluble) than a material of the lowermost layer to an etchant (explained later). For example, the intermediate layer may comprise a titanium oxide layer, while the lowermost layer may comprise a silicate layer.

After the formation of the interlayer insulator, a contact hole is formed by dry-etching at the intended contact region of the interlayer insulator. Thereafter, the lowermost layer is subjected to wet-etching with an etchant capable of dissolving the lowermost layer to form a stepped portion between the edges of the lowermost layer and the intermediate layer in the contact hole. The dry-etching is usually performed by photolithography. The etchant is employed for dissolving the edge of the lowermost layer in the contact hole. Usable etchant is the one which can dissolve the edge of the lowermost layer but cannot dissolve the edge of the intermediate layer in order to form a stepped portion at the interface between the edges of the lowermost and intermediate layers in the opening, i.e., to allow that the edge of the intermediate layer projects from that of the lowermost layer. For example, a conventional hydrofluoric acid solution [e.g., 1% hydrofluoric acid aqueous solution or a buffered hydrofluoric acid aqueous solution such as FNH$_4$:HF (10:1 or 100:1)] can be used for this etchant. The stepped portion serves to inhibit the contact plug formed in the opening at the next step from peeling off the semiconductor substrate. Usually, the stepped portion is 0.3 to 10 μm in thickness, preferably 0.5 to 2.5 μm in thickness.

Subsequent to the formation of the stepped portion, a metal such as tungsten, titanium or aluminum) is deposited in the contact hole by CVD method to form a contact plug.

According to the present invention, the edge of the lowermost layer such as a silicate glass layer in the contact hole is etched by the etchant to form the stepped portion at the interface between the edges of the lowermost layer and the intermediate layer in the contact hole. The stepped portion thus formed can prevent the contact plug, which is formed subsequently by depositing the metal in the contact hole, from peeling off the semiconductor substrate.

Next, the present invention will be described with reference to the accompanied drawings.

As shown in FIG. 1, a silicate glass (NSG) layer 2 having a thickness of 0.20 μm is deposited by atmospheric pressure CVD method at about 400° C. on a silicon substrate 1 provided with a base device (e.g., channel, source, drain or the like). Subsequently, a Si$_3$N$_4$ layer 3 having a thickness of 0.02 μm is deposited on the silicate glass layer 2 by LPCVD method at about 780° C. Deposited on the Si$_3$N$_4$ layer 3 is a boron phosphorus silicate glass (BPSG) layer 4 having a thickness of 0.6 μm by atmospheric pressure CVD method at about 400° C. Thereafter, the resultant substrate is subjected to a thermal treatment in the atmosphere of N$_2$ gas at about 900° C. for fluidizing the BPSG layer 4 to planarize the surface thereof, resulting in completing a triple-layered interlayer insulator for multilevel connection comprising the aforesaid three layers.

Next, the region of the interlayer insulator where a contact plug is to be formed is etched by photolithography to make a contact hole with a diameter of 0.5 μm. Each edge of NSG layer 2, Si$_3$N$_4$ layer 3 and BPSG layer 4 is exposed to the opening.

The resultant substrate is then treated with a buffered hydrofluoric solution (37 wt. %, 10:1) to dissolve the edge of the NSG layer 2, whereby the edge of the NSG layer 2 retreats from the edge of the Si$_3$N$_4$ layer 3.

After the substrate thus obtained is washed, a contact plug 5 is formed in the contact hole by the selective tungsten deposition in accordance with CVD method.

The contact plug 5 does not peel off the substrate, thus possessing excellent reliability.

The present invention can provide a method for forming a contact plug, in which a contact plug (especially a tungsten plug at the P-channel) does not peel off the substrate, assuring reliability.

What is claimed is:

1. A method for forming a contact plug comprising:

depositing on a semiconductor substrate provided with a base device an interlayer insulator comprising lowermost, intermediate and uppermost layers in which the intermediate layer is less sensitive to an etchant which is capable of dissolving the lowermost layer;

subjecting the resulting substrate to a thermal treatment to planarize the surface of the uppermost layer;

forming a contact hole in said lowermost, intermediate and uppermost layers by dry-etching at an intended contact region of the interlayer insulator;

subjecting the contact hole to set-etching with the etchant which is capable of dissolving the edges of the lowermost layer of said interlayer insulator to form a stepped portion between the edges of the lowermost layer and the intermediate layer in the contact hole; and depositing a metal in the resulting contact hole to form a contact plug.

2. A method of claim 1 wherein the lowermost, intermediate and uppermost layers comprise a silicate glass, silicon nitride and boron phosphorus silicate glass layers respectively.

3. A method of claim 1 wherein the etchant is a hydrofluoric acid solution selected from the group consisting of a diluted hydrofluoric acid aqueous solution and a buffered hydrofluoric acid aqueous solution.

4. A method of claim 1 wherein the lowermost, intermediate and uppermost layers comprise a silicate glass, titanium oxide and boron phosphorus silicate glass layers, respectively.

5. A method of claim 1 wherein said stepped portion is formed at the interface between the edges of the lowermost and intermediate layers so as to inhibit the removal of said contact plug from the contact hole.

* * * * *